United States Patent
Bradl et al.

(10) Patent No.: US 7,902,062 B2
(45) Date of Patent: Mar. 8, 2011

(54) ELECTRODEPOSITING A METAL IN INTEGRATED CIRCUIT APPLICATIONS

(75) Inventors: Stephan Bradl, Köfering (DE); Klaus Kerkel, Neutraubling (DE); Christine Lindner, Pyrbaum (DE)

(73) Assignee: Infineon Technologies AG, Munich (DE)

( * ) Notice: Subject to any disclaimer, the term of this patent is extended or adjusted under 35 U.S.C. 154(b) by 91 days.

(21) Appl. No.: 11/136,582

(22) Filed: May 23, 2005

(65) Prior Publication Data

US 2005/0221602 A1    Oct. 6, 2005

Related U.S. Application Data

(63) Continuation of application No. PCT/DE03/03845, filed on Nov. 20, 2003.

(30) Foreign Application Priority Data

Nov. 23, 2002  (DE) ................................. 102 54 815

(51) Int. Cl.
    *H01L 21/4763*     (2006.01)
(52) U.S. Cl. ......... 438/622; 438/674; 438/675; 438/677; 438/678; 257/E21.495; 257/E21.476
(58) Field of Classification Search ........... 257/E21.495, 257/E21.476; 438/622, 674, 675, 677, 678
    See application file for complete search history.

(56) References Cited

U.S. PATENT DOCUMENTS

| | | | |
|---|---|---|---|
| 3,625,758 A * | 12/1971 | Stahl et al. ..................... | 428/206 |
| 5,061,985 A | 10/1991 | Meguro et al. | |
| 5,151,168 A | 9/1992 | Gilton et al. | |
| 5,242,861 A * | 9/1993 | Inaba ........................... | 438/627 |
| 5,587,337 A | 12/1996 | Idaka et al. | |
| 5,824,599 A | 10/1998 | Schacham-Diamand et al. | |
| 5,913,147 A * | 6/1999 | Dubin et al. ................... | 438/687 |
| 5,933,758 A * | 8/1999 | Jain .............................. | 438/687 |
| 6,020,266 A * | 2/2000 | Hussein et al. ................ | 438/694 |
| 6,045,892 A * | 4/2000 | Lee et al. ...................... | 428/209 |
| 6,054,172 A * | 4/2000 | Robinson et al. ............. | 427/97.2 |
| 6,080,656 A * | 6/2000 | Shih et al. ..................... | 438/626 |
| 6,153,521 A | 11/2000 | Cheung et al. | |
| 6,249,055 B1 | 6/2001 | Dubin | |

(Continued)

FOREIGN PATENT DOCUMENTS

JP    2000-150647    5/2000

(Continued)

OTHER PUBLICATIONS

C.H. Seah et al., "Quality of Electroplated Copper Films Produced Using Different Acid Electrolytes", J. Vac. Sci. Technol. B 17(5), Sep./Oct. 1999, pp. 2352-2356.

(Continued)

*Primary Examiner* — Angel Roman
(74) *Attorney, Agent, or Firm* — Brinks Hofer Gilson & Lione

(57) ABSTRACT

A method is described in which a contact hole (18) to an interconnect (14) in an insulating layer (16) is fabricated. A barrier layer (20) is subsequently applied. Afterward, a photoresist layer (30) is applied, irradiated and developed. With the aid of a galvanic method, a copper contact (32) is then produced in the contact hole (18). Either the barrier layer (20) or an additional boundary electrode layer (22) serves as a boundary electrode in the galvanic process. Critical metal contaminations are minimized in production.

23 Claims, 3 Drawing Sheets

U.S. PATENT DOCUMENTS

| | | | |
|---|---|---|---|
| 6,297,557 B1 * | 10/2001 | Bothra | 257/767 |
| 6,313,529 B1 | 11/2001 | Yoshihara et al. | |
| 6,341,006 B1 * | 1/2002 | Murayama et al. | 355/53 |
| 6,376,374 B1 | 4/2002 | Stevens | |
| 6,413,864 B1 | 7/2002 | Pyo | |
| 6,565,729 B2 * | 5/2003 | Chen et al. | 205/82 |
| 6,756,295 B2 * | 6/2004 | Lin et al. | 438/612 |
| 6,936,906 B2 * | 8/2005 | Chung et al. | 257/486 |
| 2002/0153569 A1 * | 10/2002 | Katayama | 257/351 |
| 2003/0052013 A1 * | 3/2003 | Ando et al. | 205/296 |

FOREIGN PATENT DOCUMENTS

| | | |
|---|---|---|
| JP | 2002-124567 | 4/2002 |
| JP | 2002-520856 | 7/2002 |
| WO | WO 99/47731 | 9/1999 |
| WO | WO 02/47139 A2 | 6/2002 |

OTHER PUBLICATIONS

J.C. Hu et al., "Investigation on Multilayered Chemical Vapor Deposited Ti/TiN Films As the Diffusion Barriers in Cu and Al Metallization", J. Vac. Sci. Technol. A 17(4), Jul./Aug. 1999, pp. 2389-2393.

Valery M. Dubin et al., "Selective and Blanket Electroless Copper Deposition for Ultralarge Scale Integration", J. Electrochem. Soc., Vo. 144, No. 3, Mar. 1997, pp. 898-908.

D. Widmann, H. Mader, H. Fredrich, "Technologie hochintegrierter Schaltungen," Mit 208 Abbildungen and 29 Tabellen, Springer.

Japanese Office Action dated Mar. 19, 2008, Japanese Patent Application No. 2004-554209, pp. 1-9.

European Search Report Dated Jan. 5, 2009 and English Translation of Same.

European Office Action Dated Jul. 3, 2009 and English Translation.

* cited by examiner

ELECTRODEPOSITING A METAL IN INTEGRATED CIRCUIT APPLICATIONS

PRIORITY AND CROSS REFERENCE TO RELATED APPLICATION

This application is a continuation of International Application No. PCT/DE03/03845 filed Nov. 20, 2003, which claims priority to German application 102 54 815.3 filed Nov. 23, 2002, both of which are incorporated herein in their entirety by reference.

BACKGROUND

1. Field of the Invention

The present invention relates to the field of the application of metal or a metal alloy in the fabrication of an integrated circuit arrangement, and more particularly, it relates to a method for electrodepositing a copper metal.

2. Description of the Related Art

Requirements for an increased performance of semiconductor chips lead to ever higher packing densities in addition to ever higher current densities in metallization planes or metallization layers of an integrated circuit (e.g., power semiconductors configured to switch a number of amperes). Problems due to electromigration and heating come to the fore and limit the performance of the components. By way of example, copper or copper alloy have been used in place of conventional tungsten or aluminum. Copper enables higher current densities and a thermal conductivity by a factor of 2. Due to the high diffusion coefficient of copper silicon, however, copper also increases risks to the transistor planes. A diffusion of copper atoms into the active regions alters, for example, the threshold voltage, the channel length or the switching time of a transistor. The diffused atoms may act as a defect, a center for charge carriers, generation or recombination, cause a shortening of the lifetime of charge carriers, and/or introduce oxidation induced stacking faults and weak points in thin oxide layers. Accordingly, a failure of a transistor may occur. Accordingly, it is necessary to prevent the diffusion of copper atoms or other atoms having a large diffusion coefficient in silicon. The barrier layer alone is not sufficient for this purpose, because it is also described to prevent a copper cross contamination within the production line.

BRIEF SUMMARY OF THE INVENTION

By way of introduction only, a method for the application of a metal, in particular of copper or a copper alloy is described, including uses of the method and an integrated circuit arrangement.

A plurality of contact holes to interconnects of a metallization layer may be produced in an insulating layer of an integrated circuit arrangement. A barrier layer is subsequently applied, for example by being sputtered on. A contact hole is also referred to as a via, if it does not lead directly as far as a semiconductor carrier substrate of the integrated circuit arrangement. The contact hole has e.g. a diameter which is significantly less than 1 μm (micrometer) or which is greater than 1 μm or even greater than 10 μm.

The barrier layer increases the adhesion between the metal and the insulating layer and may provide a diffusion barrier for the atoms of the metal. Atoms may be prevented from penetrating into active regions of the semiconductor carrier substrate due to the large diffusion coefficient of the atoms, and from unintentionally altering the electrical properties of integrated semiconductor components there.

The foregoing summary is provided only by way of introduction. The features and advantages of the personalized marketing architecture may be realized and obtained by means of the instrumentalities and combinations particularly pointed out in the claims. Nothing in this section should be taken as a limitation on the claims, which define the scope of the invention. Additional features and advantages of the present invention will be set forth in the description that follows, and in part will be obvious from the description, or may be learned by practice of the present invention.

DETAILED DESCRIPTION OF THE INVENTION

Figure 1A:
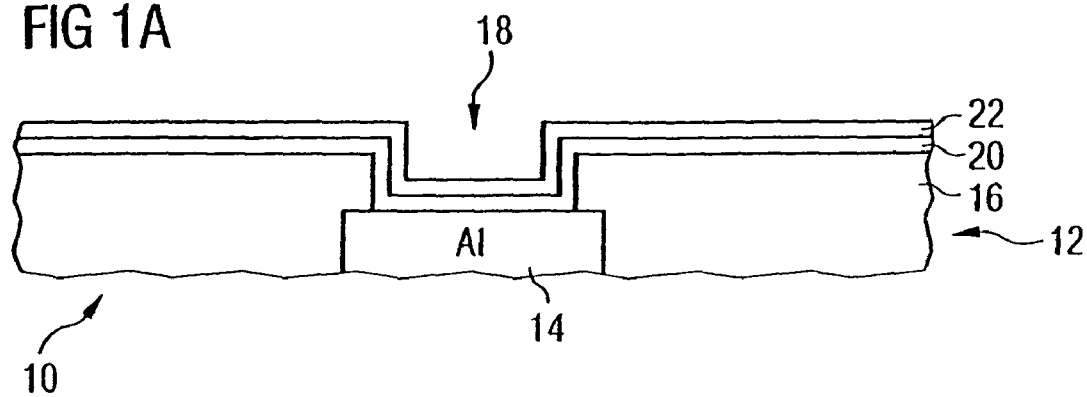
FIGS. 1A to 1C show fabrication stages in the fabrication of a copper metallization in accordance with a first method variant with an aluminum nucleation layer.

A method for electrodepositing a metal will now be described more fully with reference to the accompanying drawings. In each of the following figures, components, features and integral parts that correspond to one another each have the same reference number. The drawings of the figures are not true to scale.

In semiconductor production, in which copper may be used in metallization planes, it is desired to separate a Front End Of Line (FEOL) production and a Back End Of Line (BEOL). FEOL production relates, inter alia, to method steps for fabricating Shallow Trench Isolation (STI), Local Oxidation of Silicon insulations (LOCOS), the fabrication of transistors, including the required implantations. BEOL production relates, inter alia, to the fabrication of metallization and passivation planes. By way of example, if only the last metallization layer is fabricated using a metal whose atoms have a large diffusion coefficient in silicon, then BEOL production is again subdivided into two subareas. The subdivision leads to technical dedication in respect of installations. This means that a contaminated installation is prevented for processes in which a cross-contamination between different installations is critical. The installation is often spatially separated from other production areas.

In an exemplary method, a metal or a metal alloy is applied with the aid of a galvanic processes. In a first embodiment, a barrier layer provides a boundary electrode in the galvanic process for the application of the metal or the metal alloy. In a second embodiment, in addition to the barrier layer, before the application of a radiation sensitive layer, a boundary electrode layer is applied, which does not contain a metal whose atoms have a large diffusion coefficient in silicon, or which is not a metal alloy in which more than 5% of the atoms have a large diffusion coefficient in silicon, and which includes a material having a different material composition than the barrier layer. The method utilizes a galvanic deposition of the metal which is suitable both for depositing relatively small layer thicknesses of between 30 nm and 300 nm, by means of a method free of external current, or a method using external current, and also for depositing relatively large layer thicknesses.

Layer thicknesses of greater than 1 μm or greater than 10 μm can be produced by a method using external current or in a combined galvanic method. However, the method according to the invention uses a boundary electrode layer whose atoms have a small diffusion coefficient in silicon (i.e. precisely do not have a large diffusion coefficient in silicon). This provides the advantage, for example, that a lithographic method for defining the position of the metal structures that are to be produced galvanically can be carried out, if appropriate up to the removal of resist, completely by machines which, when carrying out the method, are not contaminated with the metal of which the galvanically deposited metal layer is composed. These installations are therefore available to production without any restriction.

In the exemplary first embodiment, the barrier layer is used as a boundary electrode layer and an additional boundary electrode layer does not have to be applied. Contamination problems are significantly reduced, or eliminated during the application of the barrier layer and of the radiation-sensitive layer.

In the exemplary second embodiment, however, a boundary electrode layer is applied in addition to the barrier layer. This results in a degree of freedom, namely the choice of the material of the boundary electrode layer. Through the use of a suitable material, the galvanic method can be carried out in a simpler manner than without the use of an additional boundary electrode layer, in particular with regard to the requirements made of complying with process parameters. In order that no contaminations occur during the application of the boundary electrode layer and during the application of further layers, for example a radiation sensitive layer, the boundary electrode layer comprises a metal whose atoms have a small diffusion coefficient in silicon, i.e. precisely do not have a large diffusion coefficient D in silicon.

In one development, a radiation sensitive layer may be applied after the application of the barrier layer. The radiation sensitive layer is irradiated according to a pattern, and the radiation sensitive layer is developed after irradtiation. A metal or a metal alloy is applied into regions that are free of the radiation sensitive layer after the development, with the aid of a galvanic method. Residues are removed from the radiation sensitive layer after the application of the metal or the metal alloy. Electrodeposition may also be effected over the whole area of the boundary electrode layer, after which, for example, a chemical mechanical polishing method (CMP) is then performed.

In another development, the metal or metal alloy that is galvanically applied may have a large diffusion coefficient in silicon. The diffusion coefficient of the atoms of the metal is e.g. greater than $10^{-9}$ cm²/s at 400° C. Thus, the following holds true for copper for a temperature T in the range of between 400° C. (degrees Celsius) and 900° C.:

$$D[cm^2/s]=4.7\ 10^{-3}\ \exp(e_a/kT),$$

where $e_a$ is the activation energy in eV (electron volts), in this case 0.43 eV, and k is Boltzmann's constant.

The same applies to a metal alloy to be applied galvanically in which more than 5% by weight, more than 50% by weight or even more than 90% by weight of the atoms have a large diffusion coefficient in silicon. The additions often have only a small proportion of e.g. less than 5% by weight. As an alternative, however, a different metal or a different metal alloy may also be deposited galvanically, e.g. comprising a material having a small diffusion coefficient, e.g. aluminum. If a material having a large diffusion coefficient is subsequently deposited onto this material, then the same considerations as explained above apply with regard to the contamination.

In another development, the galvanic process is carried out using an external current or voltage source. The external current or voltage source leads to a higher deposition speed. In addition, reducing agents and catalysts are added to the galvanic bath in the case of a method using external current.

In another development, a galvanic method free of external current is carried out. The deposition rate for a layer thickness of one micrometer is furthermore in the minutes range and is e.g. less than 10 minutes. However, distortions of the electric field as occur in the case of a method with an external current or voltage source are avoided. A metal layer of uniform thickness is produced as a result. The crystal lattice that forms during the galvanic method free of external current becomes much more uniform in comparison with the galvanic method with an external current or voltage source, and also more homogeneous on account of the longer time for the deposition. This reduces the electrical resistance of the layer, so that less heat is generated with the current flow remaining the same. In addition, the more homogeneous crystal lattice is more resistant to electromigration. These technical properties are all the more important the higher the current intensities to be switched.

In a second aspect, the invention also relates to a method for the application of metal by means of a galvanic method free of external current. The galvanic layer deposited in a manner free of external current is particularly dense and particularly uniform. The resulting improved electrical properties of the galvanic layer deposited in a manner free of external current in comparison with a deposition using external current, in particular the lower electrical resistance and the resistance to electromigration, are of particular importance for many applications, (e.g. in contact holes at locations at which the current density is very high). The barrier layer is used as a boundary electrode layer and an additional boundary electrode layer does not have to be applied. Alternatively, a boundary electrode layer may be applied in addition to the barrier layer to provide a degree of freedom, namely in the choice of the material of the boundary electrode layer. Through the use of a suitable material, the galvanic method can be carried out in a simpler manner than without the use of an additional boundary electrode layer with respect to the barrier layer.

In one development of the method in accordance with the second aspect, use is made of a metallic boundary electrode layer whose atoms have a large diffusion coefficient in silicon, or a metal alloy layer in which more than 5% of the atoms have a large diffusion coefficient in silicon. As an alternative, the boundary electrode layer used is a layer which is not a metal layer of said type or a metal alloy layer of said type, for example a barrier layer or a boundary electrode layer applied in addition to the barrier layer.

In a next development of the method in accordance with the first aspect or of the method in accordance with the second aspect, the material of the boundary electrode layer has a lower potential in the electrochemical series and the galvanically deposited metal or the galvanically deposited metal alloy. The electrochemical series specifies the voltages established in different materials if the latter are combined with a reference electrode, namely a hydrogen electrode, to form a galvanic cell. The following hold true, by way of example:

Li–3.04 V (volts),
Al–1.66 V,
Ti–1.628 V,
Ni–0.23 V,
$H_2$ _0 V,
Cu+0.35 V,
Ag+0.8 V,
Hg+0.85 V,
Pt+1.2 V
Au+1.41 V.

By way of example, it holds true for copper Cu that, with few exceptions, e.g. for gold Au, for platinum Pt, for mercury Hg and for silver Ag, virtually all the metals are oxidized in the presence of copper ions, metals that are more electronegative going into a solution and the dissolved copper ions being deposited as a metallic coating.

Therefore, in one development, an electrolyte solution used for the galvanic method contains metal ions, in particular copper ions. The solution may be based on water, alcohol, ether, or any combination thereof. Further additions may not be necessary for an electrochemical deposition on account of the potential difference (i.e. in particular no reducing agents such as formaldehyde or any catalysts for a precipitation reaction).

The electrolyte solution may contain only a small number of constituents, for example only the molecules of the basic solution (e.g. water molecules, the metal ions and ions of opposite polarity which form a salt with the metal ions, said salt being dissolved in the electrolyte solution). On account of the electrodeposition as a result of potential differences, neither the temperature nor the pH of the electrolyte solution are critical in the galvanic method free of external current. By way of example, the method is carried out at room temperature, i.e. at 20° C. for example. Heating the electrolyte solution accelerates the deposition, but leads to more rapid evaporation of the solvent, and thus to an alteration of the concentrations in the electrolyte solution. Cooling below the temperature mentioned leads to a more uniform layer growth, but to a slower deposition rate.

In a method free of external current, depending on the salt used, the pH of the electrolyte solution lies in the range from 1 to 6, i.e. in the acidic range, for example, when using copper sulfate $CuSO_4$, or in the range of between 8 and 14, i.e. in the basic range, for example, when using copper hydroxide $Cu(OH)_2$.

The boundary electrode layer applied in addition to the barrier layer may be decomposed completely or as far as a partial layer during the galvanic method. The barrier layer may be decomposed in a partial layer. The remaining part of the barrier layer still ensures a sufficient diffusion barrier.

An etching operation may also be carried out after the removal of the radiation-sensitive layer, during which etching operation the barrier layer is etched in accordance with the metal structures produced during the electrodeposition, preferably in a simple wet-chemical etching process.

The interconnect may contain aluminum or an aluminum alloy, for example aluminum with a small addition of silicon or copper, e.g. of one per cent by weight. The methods according to the invention are particularly suitable for fabricating the topmost metallization layer. By way of example, the lower metallization layers comprise aluminum or an aluminum alloy which contains more than 90% by weight, or more than 95% by weight of aluminum (i.e. a readily processable material).

The barrier layer may also contain, for example, tungsten, titanium or tantalum (i.e. metals having a melting point of greater than 1600° C.). In one refinement, a nitride layer of such a metal is also used. These barrier layers are particularly suitable as a diffusion barrier and adhesion-promoting layers.

The boundary electrode layer additionally applied to the barrier layer may also include aluminum or an aluminum alloy which contains e.g. more than 90% by weight or more than 95% by weight of aluminum (i.e. a material that can readily be processed in terms of process engineering).

The galvanically deposited metal may be copper, gold, silver or platinum. Metal alloys with a plurality of these substances are also used.

The contact hole may have a diameter greater than 1 μm (micrometer), greater than 10 μm or even greater than 20 μm. In one refinement, the layer thickness of the deposited layer is greater than 100 nm (nanometers) or greater than 500 nm or even greater than 10 μm, if a method using external current is utilized for the electrodeposition. However, contact holes having a diameter of less than 1 μm can also readily be produced by means of a method free of external current, if appropriate in combination with an external current method.

The method may be applied to fabricate an integrated power circuit through which currents of greater than 1 A (ampere), greater than 10 A or even greater than 100 A flow during switching. In particular, with the use of electrodeposition methods free of external current, it is possible to produce electrical connections with a very low electrical resistance and high resistance to electromigration, as are required for such high currents.

In another application, the exemplary method serve to fabricate a plurality of carrier circuits and to fabricate a plurality of carried circuits. A plurality may include, by way of example, a production quantity of several thousand circuits. A carried circuit is applied on a carrier circuit with the aid of a chip rapid-mounting technique. This technique is also referred to as a flip-chip technique. By way of example, the two circuits are soldered such that their active sides face one another. As an alternative, it is also possible to use other fixing methods of the flip-chip technique.

In additional, an integrated circuit arrangement having a contact hole containing a metal or a metal compound whose atoms have a large diffusion coefficient in silicon is provided. The metal or the metal compound has a crystal lattice homogeneity as arises only during a galvanic deposition method free of external current. As a result, the electrical properties of the contact are considerably better in comparison with contacts which have been sputtered or fabricated galvanically with the aid of an external current or voltage source.

Figure 1B:
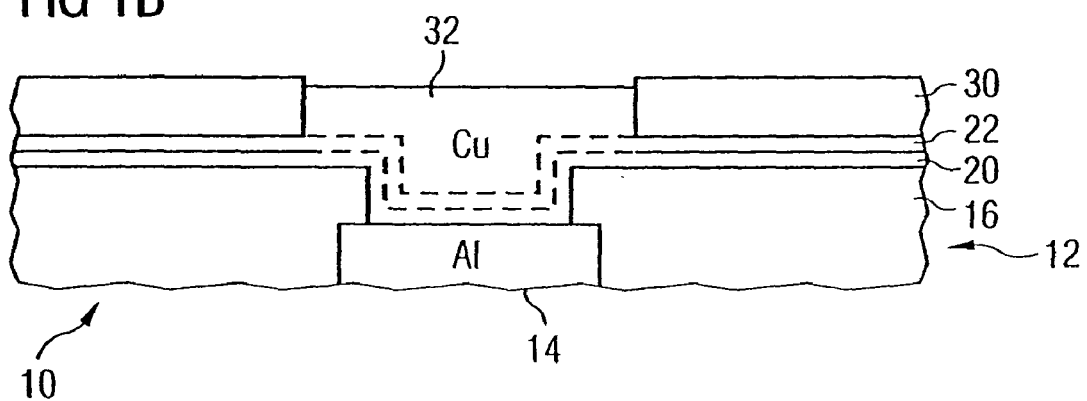
Figure 1C:
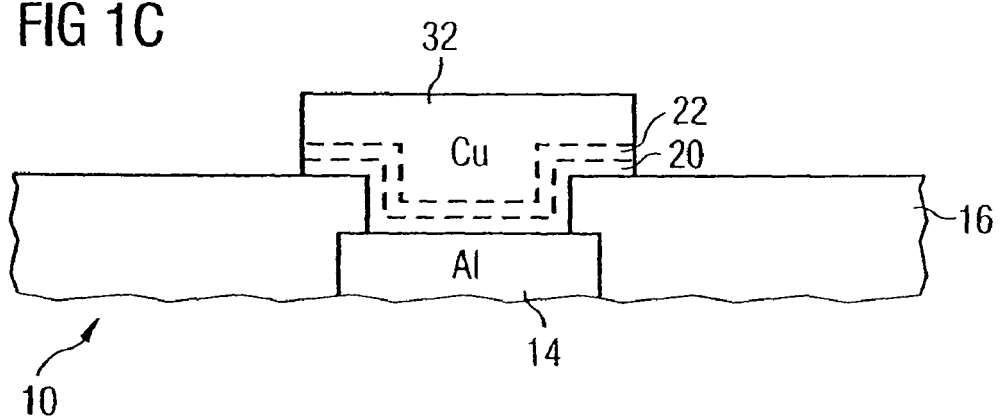

FIGS. 1A to 1C illustrate fabrication stages for a last metallization layer of an integrated circuit arrangement 10 in accordance with a first method variant. The integrated circuit arrangement 10 includes at least one metallization layer 12, in which a plurality of aluminum interconnects are arranged, for example an interconnect 14. After the fabrication of the metallization layer 12, an insulating layer 16 is deposited. The insulating layer may be silicon dioxide or a borophosphosilicate glass (BPSG) material.

Using photolithography, a plurality of contact holes (i.e. vias), are then produced in the insulating layer 16, for example a contact hole 18 leading to the interconnect 14.

A barrier layer 20 is subsequently deposited, where the barrier layer includes, for example, tungsten-titanium WTi or nickel Ni. The barrier layer 20 was applied for example with the aid of a sputtering method and has a thickness of less than 100 nm (nanometers).

An aluminum nucleation layer 22 is then applied, for example with the aid of a sputtering method. The aluminum nucleation layer 22 includes aluminum Al and has a thickness of 50 nm, for example, in the exemplary embodiment. In other exemplary embodiments, the thickness of the nucleation layer 22 is likewise less than 100 nm.

As illustrated in FIG. 1B, a photoresist layer 30 is subsequently applied. The photoresist layer may be 30 μm (micrometers) or more in thickness. The photoresist layer 30 is exposed and developed in accordance with predetermined mask structures, where it being possible to utilize installations which have not been contaminated with copper and are also not contaminated with copper.

After the patterning of the photoresist layer 30, an electrodeposition method free of external current is performed using a copper sulfate solution $CuSO_4$. In this case, a copper contact 32 is deposited in the contact hole 18 and above the contact hole 18. During the electrodeposition, the aluminum nucleation layer 22 is decomposed in the region of the contact hole 18. The barrier layer 20 is decomposed only in an upper partial layer, so that it function as a diffusion barrier to a sufficient extent.

At the end of the method free of external current, the copper contact 32 does not project or projects only slightly into the lower part of the cutout contained in the photoresist layer 30. If the contact hole 18 has already been filled at the end of the method free of external current, the electrodeposition is ended. By contrast, if the contact hole 18 has still not been filled at the end of the method free of external current, or if the copper contact is intended to project further beyond the insulating layer 16, then a method using external current is used for further electrodeposition. As an alternative, electrodeposition is also effected only by means of an external current method.

As illustrated in FIG. 1C, residues of the photoresist layer 30 are subsequently removed. Afterward, by means of a wet-chemical etching method or by means of a dry etching method, the aluminum nucleation layer 22 is removed in regions which are not covered by the copper contact 32. Likewise by means of a wet-chemical etching method or by means of a dry etching method, the barrier layer 20 is removed in regions which are not covered by the copper contacts (e.g. by the copper contact 32).

The method explained with reference to FIGS. 1A to 1C can be carried out with a comparatively or relatively thin barrier layer 20. This facilitates the process implementation. By way of example, a thin barrier layer adheres better than a thicker barrier layer.

Figure 2A:
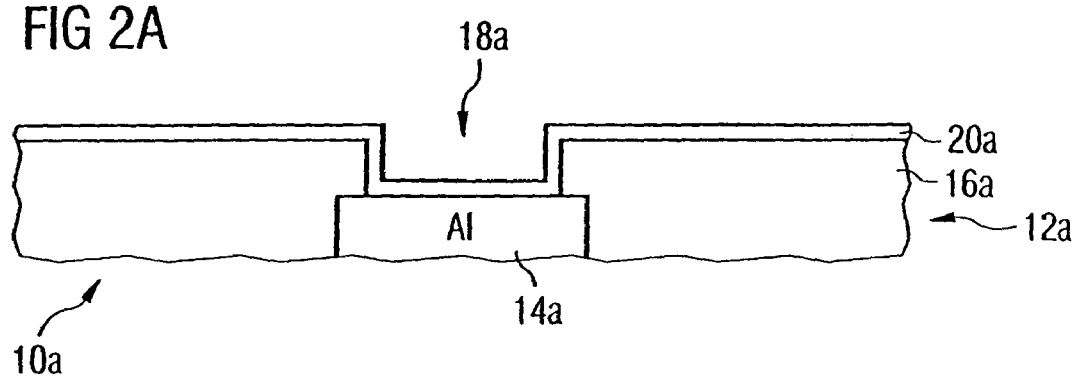
FIGS. 2A to 2C show fabrication stages in the fabrication of a copper metallization in accordance with a second method variant with a barrier layer as nucleation layer.
Figure 2B:
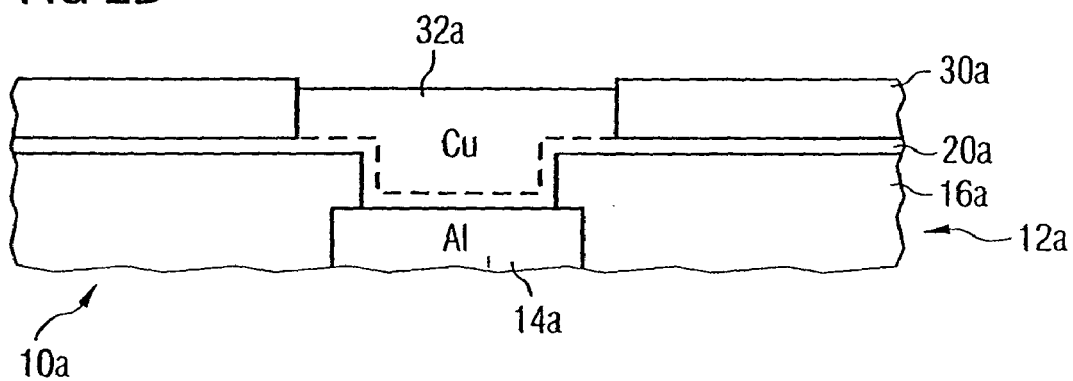
Figure 2C:
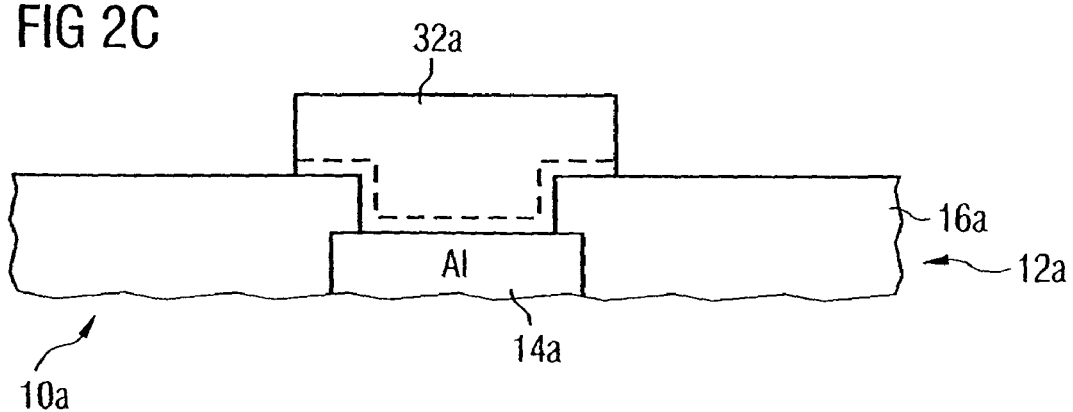

FIGS. 2A to 2C show fabrication stages in the fabrication of a copper metallization directly on a barrier layer. As illustrated in FIG. 2A, an integrated circuit arrangement 10a contains a metallization layer 12a. The metallization layer 12a contains an interconnect 14a made of aluminum. An insulating layer 16a comprising the same material as the insulating layer 16 was applied to the metallization layer 12a. Afterward, the insulating layer 16a was patterned with the aid of a photolithographic method, a contact hole 18a having been produced above the interconnect 14a.

A barrier layer 20a was subsequently applied. The barrier layer includes, for example, a double layer of titanium Ti and titanium nitride TiN. The thickness of the barrier layer 20a is such that tensile stresses are minimized and that, on the other hand, however, a sufficiently thick layer is also present after a partial decomposition of the barrier layer 20a in a galvanic method free of external current.

As illustrated in FIG. 2B, a photoresist layer 30a is subsequently applied to the barrier layer 20a. The photoresist layer 30a has, for example, a thickness of 30 μm. The photoresist layer 30a is then exposed and developed in a photolithographic method, installations which have not been contaminated with copper and are also not contaminated with copper again being used.

Afterward, a copper contact 32a made of copper Cu is produced in the region of the contact hole 18a (e.g. with the aid of an electrodeposition method free of external current). An upper partial layer of the barrier layer 20a decomposes during the electrodeposition, see broken line 50.

As illustrated in FIG. 2C, the residues of the photoresist layer 30a are subsequently removed, for example, by means of a wet-chemical cleaning step. In a wet-chemical etching process, the barrier layer 20a is then removed in regions which are not covered by the copper contact 32a.

As an alternative, only a galvanic method using external current or a combined method is used in the method explained with reference to FIGS. 2A to 2C as well.

Figure 3:
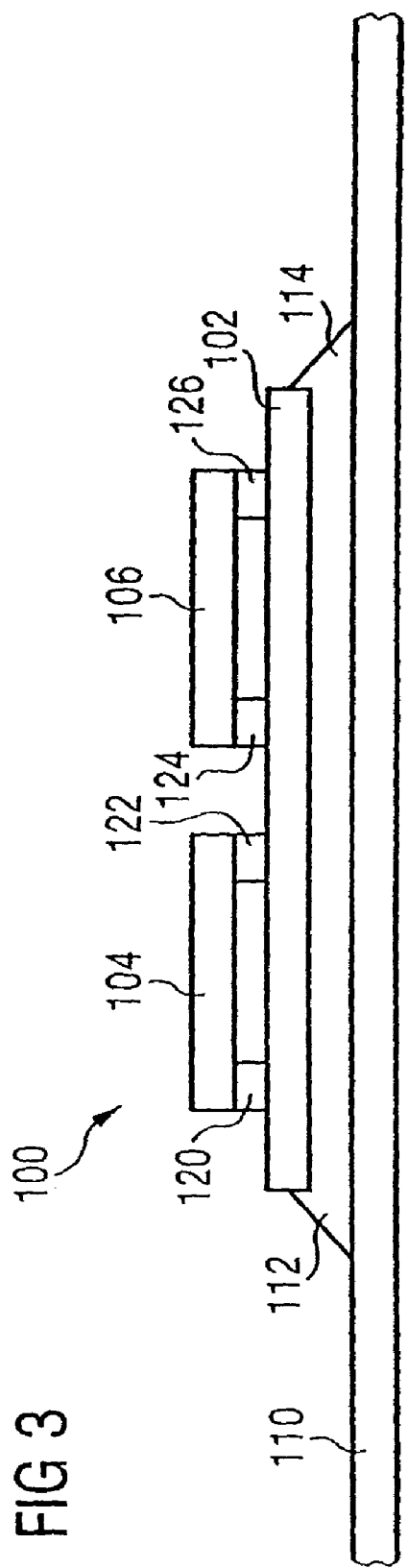
FIG. 3 shows an integrated circuit arrangement fabricated by a flip chip technique.

FIG. 3 shows an arrangement 100 comparing an integrated processor circuit 102 and two integrated memory circuits 104 and 106. The arrangement 100 is arranged on a printed circuit board 110, connecting wires 112 and 114 leading from the processor circuit 102 to the printed circuit board 110.

The integrated circuit arrangements 102 to 106 have been fabricated by means of the method explained with reference to FIGS. 1A to 1C or by means of the method explained with reference to FIGS. 2A to 2C. After the fabrication of the integrated circuits 102 to 106, the two memory circuits 104 and 106 were soldered to the processor circuit 102 using a so-called chip rapid-mounting technique (flip chip technique), see soldering points 120 to 126. An adhesive bonding technique can be used as an alternative. The active sides of the memory circuits 104 and 106 face the active side of the processor circuit 102.

The arrangement illustrated in FIG. 3 can be fabricated viably in large numbers when the method according to the invention is used to fabricate the integrated circuits 102 to 106. In the case of other methods, the contamination of installations would no longer be tenable.

The process implementation explained above introduces advantages for providing aluminum processing methods that are standard processes in BEOL. In addition, existing installations and processes may be utilized without any restriction and dedication of exposure installations may be eliminated. The methods may reduce costs. The methods may provide a clear separation between FEOL and BEOL with little or no risk of contamination, and higher flexibility and modularity.

What is claimed is:

1. A method for the application of metal in an integrated circuit, comprising:
    producing a contact hole to a metal line of aluminum or aluminum alloy in an insulating layer of an integrated circuit arrangement;
    applying a barrier layer over the metal line after producing the contact hole;
    applying a radiation-sensitive layer after applying the barrier layer;
    forming an opening through the radiation-sensitive layer over the contact hole;
    applying a copper or a copper alloy in the contact hole using a galvanic method forming a copper via; and
    producing a boundary electrode layer after producing the barrier layer and before applying the radiation-sensitive material, wherein the boundary electrode layer is comprised of aluminum or an aluminum alloy.

2. The method of claim 1, further comprising:
    irradiating the radiation-sensitive layer in accordance with a pattern;
    developing the radiation-sensitive layer after the irradiation; and
    removing residues of the radiation-sensitive layer after the application of the metal.

3. The method of claim 1, wherein the galvanic process is carried out using an external power source.

4. The method of claim 1, wherein the galvanic process is carried out in a manner free of external current.

5. The method of claim 1, wherein the copper or the copper alloy applied in the contact hole form a conductive layer, and wherein the metal line, the boundary electrode layer, the barrier layer, and the conductive layer form a layer structure where the metal line contacts the boundary electrode layer, the boundary electrode layer contacts the barrier layer, and the barrier layer contacts the conductive layer.

6. The method of claim 1, wherein a machine is utilized which has not been contaminated with copper and which will also not be contaminated with copper during at least one of applying of a radiation to the radiation-sensitive layer and developing the radiation-sensitive layer.

7. A method for the application of metal in an integrated circuit comprising:
   producing a contact hole to a metal line of aluminum or an aluminum alloy in an insulating layer of an integrated circuit arrangement;
   applying a barrier layer over the metal line after the production of the contact hole;
   applying a radiation-sensitive layer after applying the barrier layer;
   forming an opening through the radiation-sensitive layer over the contact hole;
   applying a boundary electrode layer in a galvanic process free of external current for the application of metal or a metal alloy;
   applying a copper or a copper alloy in the contact hole using a galvanic method forming a copper via; and
   wherein the boundary electrode layer is comprised of aluminum or an aluminum alloy.

8. The method of claim 7, wherein the boundary electrode layer comprises a metal whose atoms have a large diffusion coefficient in silicon.

9. The method of claim 7, wherein the boundary electrode layer is not a metal alloy in which more than 5% of the atoms have a large diffusion coefficient in silicon.

10. The method of claim 7, wherein the boundary electrode layer is characterized by a lower potential in the electrochemical series than the copper or the copper alloy.

11. The method of claim 10, wherein a solution used for the galvanic process comprises ions produced from atoms having a large diffusion coefficient in silicon.

12. The method of claim 11 wherein the solution is prepared on the basis of any one of water, alcohol, ether or any combination thereof.

13. The method of claim 11, wherein the solution is free of substances which precipitate the metal in the absence of a potential difference at a boundary electrode, and wherein the electrolyte solution is free of a reducing agent, wherein the applying of the metal is performed by electrodeposition as a result of potential differences due an electrochemical process.

14. The method of claim 7, wherein the boundary electrode layer is decomposed during the galvanic method, and wherein the barrier layer is decomposed in a partial layer during the galvanic method.

15. The method of claim 7, further comprising, etching the barrier layer in accordance with the metal structures produced, after the removal of the radiation-sensitive layer, using in a wet-chemical etching process.

16. The method of claim 15, wherein the etching is performed without carrying out a further lithographic method.

17. The method of claim 7, wherein the barrier layer comprises a metal having a melting point of greater than 1600° C., the barrier layer contains a metal whose atoms have a small diffusion coefficient in silicon, and wherein the barrier layer comprises a nitride.

18. The method of claim 17, wherein the barrier layer is any one tungsten, nickel, tantalum, tantalum nitride, titanium or titanium nitride.

19. The method of claim 7, wherein the contact hole has a diameter of at least about 1 μm, and wherein the layer thickness of the galvanic layer is at least about 1 μm.

20. The method of claim 19, wherein the integrated circuit is a power circuit through which currents greater than 10 A or greater than 100 A flow.

21. The method of claim 7, wherein the barrier layer is located in the contact hole between the boundary electrode layer and the metal line.

22. The method of claim 7, wherein the copper or the copper alloy applied in the contact hole form a conductive layer, and wherein the metal line, the boundary electrode layer, the barrier layer, and the conductive layer form a layer structure where the metal line contact the boundary electrode layer, the boundary electrode layer contacts the barrier layer, and the barrier layer contacts the conductive layer.

23. The method of claim 7, wherein a machine is utilized which has not been contaminated with copper and which will also not be contaminated with copper during at least one of applying of a radiation to the radiation-sensitive layer and developing the radiation-sensitive layer.

* * * * *